US009933493B2

(12) United States Patent
Lin

(10) Patent No.: US 9,933,493 B2
(45) Date of Patent: *Apr. 3, 2018

(54) BATTERY MANAGEMENT SYSTEM

(71) Applicant: VIA TECHNOLOGIES, INC., New Taipei (TW)

(72) Inventor: Yi-shing Lin, New Taipei (TW)

(73) Assignee: VIA TECHNOLOGIES, INC., New Taipei (TW)

( * ) Notice: Subject to any disclaimer, the term of this patent is extended or adjusted under 35 U.S.C. 154(b) by 160 days.

This patent is subject to a terminal disclaimer.

(21) Appl. No.: 15/202,065

(22) Filed: Jul. 5, 2016

(65) Prior Publication Data
US 2016/0313406 A1  Oct. 27, 2016

Related U.S. Application Data

(62) Division of application No. 13/923,777, filed on Jun. 21, 2013, now Pat. No. 9,459,322.

(30) Foreign Application Priority Data

Jun. 21, 2012  (TW) .............................. 101122165 A

(51) Int. Cl.
    *H02J 7/00*      (2006.01)
    *G01R 31/36*     (2006.01)

(52) U.S. Cl.
    CPC ..... *G01R 31/3658* (2013.01); *G01R 31/3606* (2013.01)

(58) Field of Classification Search
    CPC .................. G01R 31/3658; G01R 31/3606
    USPC .................. 320/116–119, 134, 136; 324/426
    See application file for complete search history.

(56) References Cited

U.S. PATENT DOCUMENTS

| 5,867,007 | A  | 2/1999  | Kim |
| 5,914,606 | A  | 6/1999  | Becker-Irvin |
| 7,196,496 | B2 | 3/2007  | Yamada et al. |
| 8,476,869 | B2 | 7/2013  | Shiu et al. |
| 2004/0157091 | A1 | 8/2004 | Dewey |
| 2006/0012336 | A1 | 1/2006 | Fujita |
| 2007/0241732 | A1 | 10/2007 | Luo et al. |

(Continued)

FOREIGN PATENT DOCUMENTS

| CN | 1499216   | 5/2004 |
| CN | 101207276 | 6/2008 |

(Continued)

*Primary Examiner* — Drew A Dunn
*Assistant Examiner* — Zixuan Zhou
(74) *Attorney, Agent, or Firm* — McClure, Qualey & Rodack, LLP

(57) ABSTRACT

A battery management system for a battery pack including a plurality of battery cells connected in series is provided. The battery management system includes a first switching unit coupled to an anode of a first battery cell of the battery pack, having a first P-type transistor coupled to the anode of the first battery cell, a first resistor coupled between the anode of the first battery cell and a gate of the first P-type transistor, and a current mirror coupled to the gate of the first P-type transistor and the first resistor, draining a first mirror current from the first resistor in response to a control signal, so as to turn on the first P-type transistor. The system further includes a detection circuit coupled to the first switching unit.

11 Claims, 6 Drawing Sheets

(56) References Cited

U.S. PATENT DOCUMENTS

| | | | |
|---|---|---|---|
| 2010/0289497 A1* | 11/2010 | Lum-Shue-Chan | ............................ G01R 31/3658 324/426 |
| 2011/0074431 A1* | 3/2011 | Li | ...................... G01R 31/3658 324/426 |
| 2011/0298463 A1* | 12/2011 | Saito | ..................... H02J 7/0016 324/426 |

FOREIGN PATENT DOCUMENTS

| | | |
|---|---|---|
| CN | 101383523 | 3/2009 |
| EP | 2 043 221 | 4/2009 |
| JP | H1198698 | 4/1999 |
| TW | 567331 | 12/2003 |
| TW | 201110504 | 3/2011 |

\* cited by examiner

BATTERY MANAGEMENT SYSTEM

CROSS REFERENCE TO RELATED APPLICATIONS

This application is a Divisional of pending U.S. patent application Ser. No. 13/923,777, filed on Jun. 21, 2013, which claims priority of Taiwan Patent Application No. 101122165, filed on Jun. 21, 2012, the entirety of which is incorporated by reference herein.

BACKGROUND OF THE INVENTION

Field of the Invention

The invention relates to a battery management system, and more particularly, to a battery management system capable of detecting a voltage of a battery cell.

Description of the Related Art

In general, battery management systems must detect a voltage of each battery cell within a battery pack when the battery pack is charged or discharged, to further determine whether the each battery cell is normal. The battery cells are connected in series in the battery pack.

Taking a battery pack comprising sixteen battery cells as an example, if the maximum voltage provided by each battery cell is 3.75V, the maximum voltage provided by the battery pack is 60V in total. Typically, a traditional battery management system firstly drops the terminal voltage of each battery cell in the battery pack via the voltage dividers, and then selects a specific battery cell to measure the dropped terminal voltage of the specific battery via a multiplexer. After dropping the terminal voltages, the voltage of each battery cell conforms to an input voltage range of the subsequent circuits, thus avoiding damage to the devices implemented in an integrated circuit (IC). However, each battery cell needs a voltage divider. When the number of the battery cells of a battery pack is increased, the quantity of the voltage dividers is also increased, thus increasing the cost of the battery management system.

BRIEF SUMMARY OF THE INVENTION

Battery management systems are provided. An embodiment of a battery management system for a battery pack is provided, wherein the battery pack comprises a plurality of battery cells connected in series. The battery management system comprises: a first voltage divider; a plurality of first switching units, each being corresponding to one of the plurality of battery cells and each being coupled between an anode of the corresponding battery cell and the first voltage divider; and a detection circuit coupled to the first voltage divider. When a control signal directs one of the first switching units to turn on, the first voltage divider divides a first voltage difference transmitted from the one of the first switching units to obtain a first divided voltage signal, and transmits the first divided voltage signal to the detection circuit, and the detection circuit detects the first voltage difference according to the first divided voltage signal. The first voltage difference is a voltage difference between an anode of the battery cell corresponding to the one of the first switching units and a ground.

Furthermore, another embodiment of a battery management system for a battery pack is provided, wherein the battery pack comprises a plurality of battery cells connected in series. The battery management system comprises a first switching unit coupled to an anode of a first battery cell of the battery pack, and a detection circuit coupled to the first switching unit. The first battery cell comprises: a first P-type transistor coupled to the anode of the first battery cell; a first resistor coupled between the anode of the first battery cell and a gate of the first P-type transistor; and a current mirror coupled to the gate of the first P-type transistor and the first resistor, draining a first mirror current from the first resistor in response to a control signal, so as to turn on the first P-type transistor. When the first P-type transistor is turned on by the control signal, the detection circuit obtains a first voltage difference between the anode of the first battery cell and a ground via the first switching unit.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
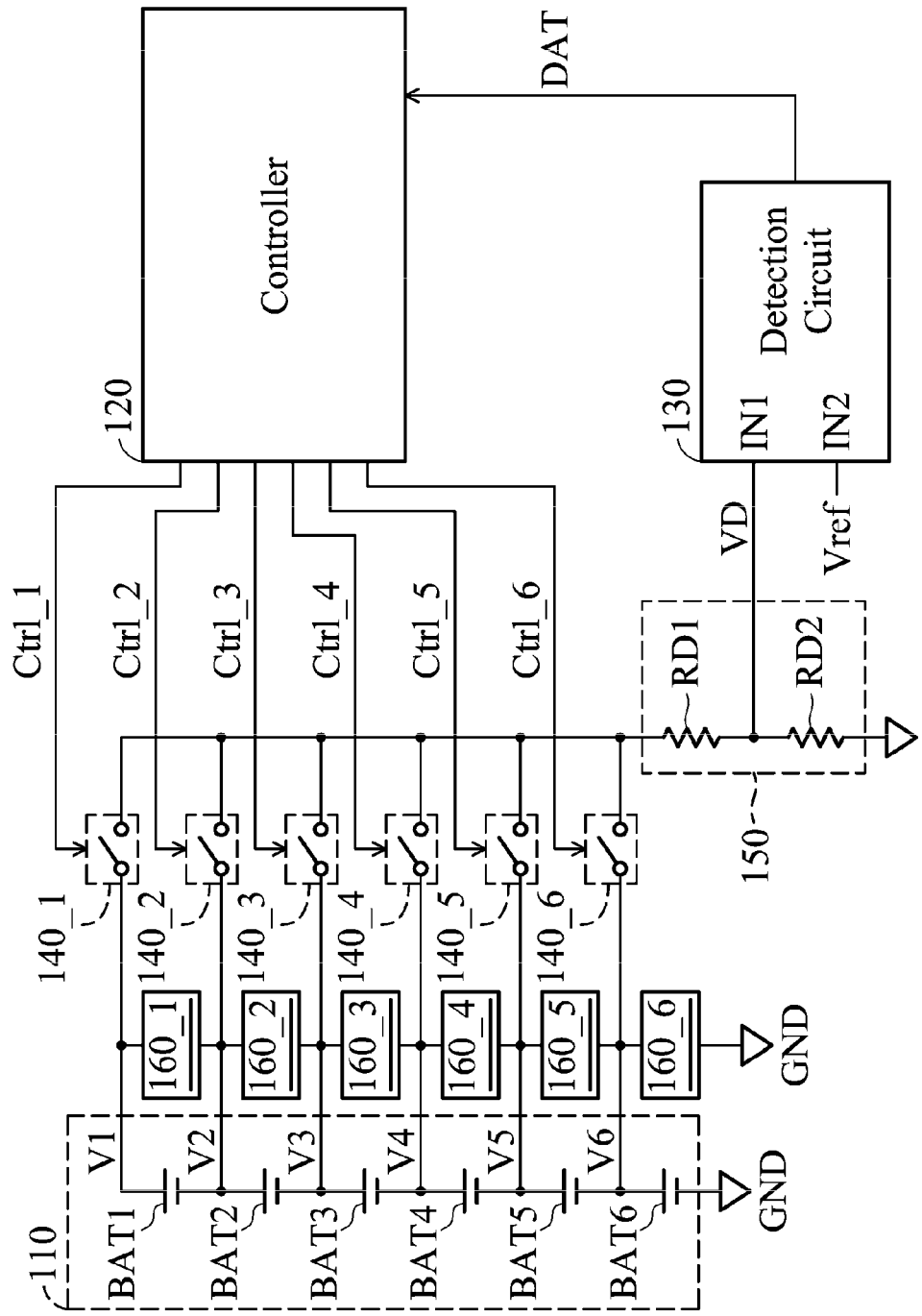
FIG. 1 shows a battery management system for a battery pack according to an embodiment of the invention.

FIG. 1 shows a battery management system 100 for a battery pack 110 according to an embodiment of the invention. The battery pack 110 comprises a plurality of battery cells BAT1-BAT6, and the battery cells BAT1-BAT6 are connected in series to couple to a ground GND. The battery management system 100 comprises a controller 120, a detection circuit 130, a plurality of switching units 140_1-140_6 and a voltage divider 150. The switching units 140_1-140_6 are the switching units capable of withstanding high voltage. Each of the switching units 140_1-140_6 is corresponding to one of the battery cells BAT1-BAT6. Each input terminal of the switching units 140_-140_6 is coupled to an anode of the corresponding battery cell, and the output terminals of the switching units 140_-140_6 are coupled to the voltage divider 150 together. In the embodiment, the input terminals of the switching units 140_1, 140_2, 140_3, 140_4, 140_5 and 140_6 are coupled to the anode of the battery cells BAT1, BAT2, BAT3, BAT4, BAT5 and BAT6, respectively. Furthermore, the switching units 140_1-140_6 are controlled by control signals Ctrl_1-Ctrl_6 from the controller 120, respectively. It should be noted that the controller 120 only directs one of the switching units 140_-140_6 to turn on while directs the other switching units to turn off. In one embodiment, the controller 120 provides the control signal Ctrl_1 to turn on the switching unit 140_1, and provides the control signals Ctrl_2-Ctrl_6 to turn off the switching units 140_2-140_6. When the switching unit 140_1 is turned on and the switching units 140_2-140_6 are turned off, a voltage difference V1 between the anode of the battery cell BAT1 and the ground GND is transmitted to the voltage divider 150. In another embodiment, the controller 120 can also provide the control signal Ctrl_2 to turn on the switching unit 140_2, and provide the control signals Ctrl_1 and Ctrl_3-Ctrl_6 to turn off the switching units 140_1 and 140_3-140_6. When the switching unit 140_2 is turned on and the switching units 140_1 and 140_3-140_6 are turned off, a voltage difference V2 between the anode of the battery cell BAT2 (i.e. a cathode of the battery cell BAT1) and the ground GND is transmitted to the voltage divider 150. According to the operations of the two embodiments above, the controller 120 uses two operations to obtain the voltage difference V1 and the voltage difference V2 respectively, so that a voltage difference between the two terminals of the battery cell BAT1 is obtained (i.e. V1-V2).

The voltage divider 150 comprises a first voltage-dividing resistor RD1 and a second voltage-dividing resistor RD2. By using the first voltage-dividing resistor RD1 and the second voltage-dividing resistor RD2, the voltage divider 150 divides a voltage (e.g. the voltage difference V1 or V2) transmitted from any one of the switching units, to obtain a voltage dividing signal VD corresponding to the received voltage (e.g. the voltage difference V1 or V2). Next, the voltage divider 150 provides the voltage dividing signal VD to an input terminal IN1 of the detection circuit 130. It should be noted that the voltage level of the voltage dividing signal VD conforms to an input signal range of the detection circuit 130. Furthermore, another input terminal IN2 of the detection circuit 130 is used to receive a reference voltage Vref with a fixed voltage level. The detection circuit 130 obtains a digital signal DAT according to the voltage dividing signal VD and the reference voltage Vref, and provides the digital signal DAT to the controller 120.

An example is used to illustrate an operation in which the battery management system 100 detects the voltage difference between the two terminals of the battery cell BAT1 in the battery pack 110. As described above, the controller 120 provides the control signal Ctrl_1 to turn on the switching unit 140_1, and provides the control signals Ctrl_2-Ctrl_6 to turn off the switching units 140_2-140_6. Therefore, the voltage difference V1 between the anode of the battery cell BAT1 and the ground GND is transmitted to the voltage divider 150. The voltage divider 150 divides the voltage difference V1, and transmits the voltage dividing signal VD corresponding to the voltage difference V1 to the detection circuit 130. The detection circuit 130 obtains the digital signal DAT corresponding to the voltage difference V1 according to the voltage dividing signal VD and the reference voltage Vref, and provides the digital signal DAT to the controller 120. Next, the controller 120 provides the control signal Ctrl_2 to turn on the switching unit 140_2, and provides the control signals Ctrl_1 and Ctrl_3-Ctrl_6 to turn off the switching units 140_1 and 140_3-140_6. When the switching unit 140_2 is turned on and the switching units 140_1 and 140_3-140_6 are turned off, the voltage difference V2 between the anode of the battery cell BAT2 (e.g. the cathode of the battery cell BAT1) and the ground GND is transmitted to the voltage divider 150. The voltage divider 150 divides the voltage difference V2, to obtain the voltage dividing signal VD corresponding to the voltage difference V2. According to the voltage dividing signal VD corresponding to the voltage difference V2 and the reference voltage Vref, the detection circuit 130 obtains the digital signal DAT corresponding to the voltage difference V2, and then provides the digital signal DAT to the controller 120. Thus, the controller 120 obtains the voltage difference between two terminals of the battery cell BAT1 according to the digital signal DAT corresponding to the voltage difference V2 and the digital signal DAT corresponding to the voltage difference V1. It should be noted that the procedure in which the digital signal DAT corresponding to the voltage difference V1 is obtained first and then the digital signal DAT corresponding to the voltage difference V2 is obtained later, is only an example, and does not limit the invention. In another embodiment, the then digital signal DAT corresponding to the voltage difference V2 is obtained first, and the digital signal DAT corresponding to the voltage difference V1 is obtained later, so as to measure the voltage of the battery cell BAT1. Moreover, the voltages of other battery cells (e.g. BAT2, BAT3, BAT4, BAT5 or BAT6) could be also obtained in the same manner. For example, by turning on the switching units 140_3, 140_4, 140_5 and 140_6, the controller 120 obtains the voltages of the battery cells BAT2, BAT3, BAT4, BAT5 and BAT6, respectively. In other words, the controller 120 can turn on one switching unit corresponding to a battery cell individually, to detect the voltage difference across the battery cell. In addition, when the controller 120 stops detecting the voltage of the battery cell, the switching units 140_-140_6 are turned off by the controller 120. Therefore, the loop between each of the battery cells BAT1-BAT6 and the ground GND is open loop, thereby avoiding current leakage from the battery pack 110 to the ground GND.

In general, each battery cell in the battery pack may not have the same characteristics. After sampling the battery cells, the manufacturer of the battery pack may select battery cells with similar characteristics (e.g. similar battery capacity) to fabricate the battery pack, so as to avoid the charge/discharge capacity of the battery pack being limited by the battery cell with the smallest capacity. For example, when the battery cell with the smallest capacity is charged to a charge cut-off voltage, the controller stops charging the battery pack. However, other battery cells in the battery pack may not be fully charged when the smallest capacity is charged to the charge cut-off voltage. Conversely, when the battery cell with the smallest capacity is discharged to a discharge cut-off voltage, the controller stops discharging the battery pack. However, the other battery cells in the battery pack may still have residual electric power, thus the residual electric power cannot be used effectively.

In FIG. 1, the battery management system 100 further comprises a plurality of balance units 160_1-160_6 for performing battery balance operations for the battery cells BAT1-BAT6 in the battery pack 110, respectively. When the controller 120 detects that a terminal voltage of any battery cell in the battery pack 110 exceeds a threshold value, the controller 120 controls the balance unit corresponding to the battery cell, to perform a battery balance operation on the battery cell (e.g. unbalance battery cell). For example, when the battery pack 110 is charged, the balance units may bypass the unbalanced battery cell, so that the unbalanced battery cell will not be charged, or the charging speed of the unbalanced battery cell is decreased. Furthermore, when the battery pack 110 is discharged, the balance unit may consume the electric power of the unbalanced battery cell, so as to balance the electric power of the battery pack 110.

Figure 2:
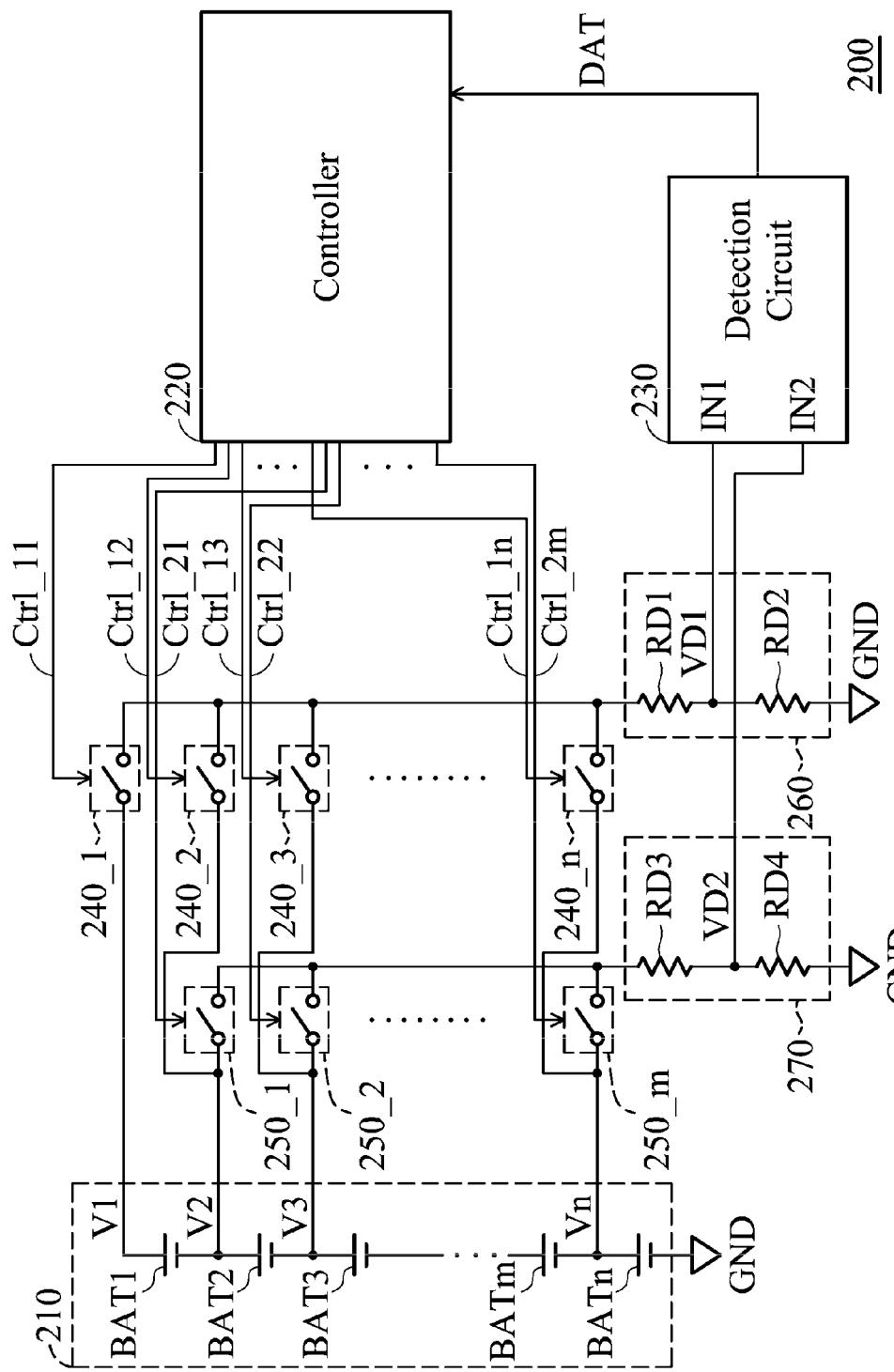
FIG. 2 shows a battery management system for a battery pack according to another embodiment of the invention.

FIG. 2 shows a battery management system 200 for a battery pack 210 according to another embodiment of the invention. The battery pack 210 comprises a plurality of battery cells BAT1-BATn, and the battery cells BAT1-BATn are connected in series to couple to the ground GND. The battery management system 200 comprises a controller 220, a detection circuit 230, a plurality of first switching units 240_1-240_n, a plurality of second switching units 250_1-250_m, a first voltage divider 260 and a second voltage divider 270. The first switching units 240_1-240_n and the second switching units 250_1-250_m are the switching units capable of withstanding high voltages. The input terminals of the first switching units 240_1-240_n are respectively coupled to the anode of the corresponding battery cell, and the output terminals of the first switching unit 240_1-240_n are coupled to the first voltage divider 260 together. For example, the input terminal of the first switching units 240_1 to 240_n are coupled to the anodes of the battery cells BAT1 to BATn, respectively. Furthermore, the first switching units 240_1-240_n are controlled by control signals Ctrl_11-Ctrl_1n from the controller 220. It should be noted that the controller 220 only directs one of the first switching units 240_1-240_n to turn on while directs the other switching units to turn off. The input terminals of the second switching units 250_1-250_m are respectively coupled to the anodes of the corresponding battery cells except the battery cell BAT1. In other word, the input terminals of the second switching units 250_1-250_m are respectively coupled to the cathodes of the corresponding battery cells except the battery cell BATn. The output terminals of the second switching units 250_1-250_m are coupled to the second voltage divider 270 together. For example, the input terminals of the second switching unit 250_1 to 250_m are coupled to the anodes of the battery cells BAT2 to BATn, respectively. In other words, the input terminals of the second switching units 250_1 to 250_m are coupled to the cathodes of the battery cells BAT1 to BATm. Moreover, the second switching units 250_1-250_m are controlled by the control signals Ctrl_21-Ctrl_2m from the controller 220. Similarly, the controller 220 only directs one of the second switching units 250_1-250_m to turn on while directs the other switching units to turn off. It should be noted that, when the controller 220 turns on the first switching unit coupled to the anode of a specific battery cell, the controller 220 also turns on the second switching unit coupled to the cathode of specific the battery cell. For example, when the controller 220 provides the control signal Ctrl_11 to turn on the first switching unit 240_1, the controller 220 also provides the control signal Ctrl_21 to turn on the second switching unit 250_1. When the first switching unit 240_1 and the second switching unit 250_1 are turned on, the controller 220 provides the control signals Ctrl_12-Ctrl_1n and Ctrl_22-Ctrl_2m to turn off the first switching units 240_2-240_n and the second switching units 250_2-250_m, respectively. Therefore, a voltage difference V1 between the anode of the battery cell BAT1 and the ground GND is transmitted to the first voltage divider 260, and a voltage difference V2 between the anode of the battery cell BAT2 (i.e. the cathode of the battery cell BAT1) and the ground GND is transmitted to the second voltage divider 270. In one embodiment, the first voltage divider 260 comprises a first voltage-dividing resistor RD1 and a second voltage-dividing resistor RD2, and the second voltage divider 270 comprises a third voltage-dividing resistor RD3 and a fourth voltage-dividing resistor RD4. The first voltage divider 260 and the second voltage divider 270 divide the voltage difference V1 transmitted from any one of the first switching units 240_2-240_n and the voltage difference V2 transmitted from any one of the second switching units 250_2-250_m, respectively, to obtain a voltage dividing signals VD1 corresponding to the received voltage (e.g. the voltage difference V1) and a voltage dividing signals VD2 corresponding to the received voltage e (e.g. the voltage difference V2). It should be noted that the voltage levels of the voltage dividing signals VD1 and VD2 conform to an input signal range of the detection circuit 230. The detection circuit 230 converts a voltage difference between the voltage dividing signal VD1 and the voltage dividing signal VD2, to obtain a corresponding digital signal DAT, and then provides the digital signal DAT to the controller 220. According to the digital signal DAT, the controller 220 may obtain a voltage difference between two terminals of the battery cell BAT1. Specifically, by controlling the first switching units and the second switching units to turn on or off, the controller 220 obtains the voltage of a specific battery cell. For example, the controller 220 obtains the voltage of the battery cell BAT2 by turning on the first switching unit 240_2 and the second switching unit 250_2 and turning off the first switching units 240_1, 240_3 to 240_n and the second switching units 250_1, 250_3 to 250_m.

In the embodiment, the controller 220 measures a voltage difference between two terminals of a single battery cell by turning on the first switching unit coupled to an anode of the single battery cell and the second switching unit coupled to a cathode of the single battery cell. It is an example and does not limit the invention. In another embodiment, the controller 220 can measure a voltage of the multiple battery cells connected in series by turning on the first switching unit and the second switching unit corresponding to various battery cells. For example, by turning on the first switching unit 240_1 and the second switching unit 250_2, the controller 220 can measure a voltage provided by the battery cells BAT1 and BAT2. Moreover, as described above, the battery management system 200 also comprises a plurality of balance units (not shown) for performing battery balance operations for the battery cells BAT1-BATn in the battery pack 210 according to the respective voltages of the battery cells measured by the controller 220.

Figure 3:
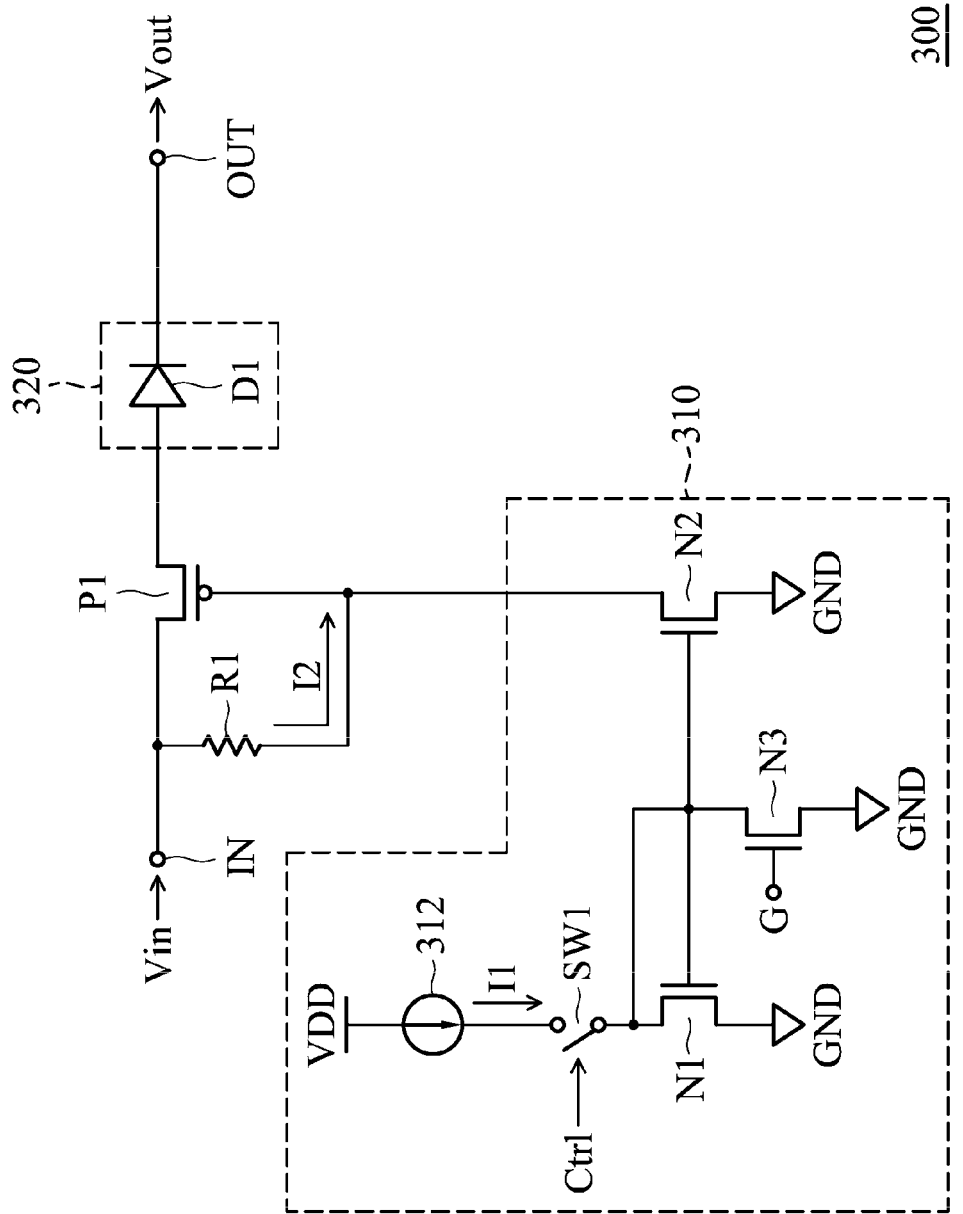
FIG. 3 shows a switching unit capable of withstanding high voltages according to an embodiment of the invention.

FIG. 3 shows a switching unit 300 capable of withstanding high voltages according to an embodiment of the invention. The switching unit 300 may be used as the switching units 140_1~140_6 of FIG. 1 or the switching units 240_1~240_n or 250_1~250_m of FIG. 2. The switching unit 300 comprises a current mirror 310, a transistor P1, a resistor R1 and a blocking unit 320. The transistor P1 is a high-voltage P-type transistor comprising a drain capable of withstanding high voltages. The resistor R1 is coupled between an input terminal IN of the switching unit 300 and a gate of the transistor P1. The transistor P1 is coupled between the input terminal IN and the blocking unit 320. The blocking unit 320 is coupled between the transistor P1 and an output terminal OUT of the switching unit 300. The blocking unit 320 only allows an electric signal to be transmitted from the input terminal IN to the output terminal OUT, and blocks an electric signal to be transmitted from the output terminal OUT to the input terminal IN, thus preventing reverse current flow from the output terminal OUT to the transistor P1. Therefore, the transistor P1 is protected from damage caused by reverse current. In the embodiment, the blocking unit 320 comprises a diode D1. The anode of the diode D1 is coupled to the transistor P1 and the cathode of the diode D1 is coupled to the output terminal OUT. It should be noted that the blocking unit 320 is only an optional component rather than a necessary component for the switching unit 300. In other embodiments, the switching unit 300 does not comprise the blocking unit 320. The current mirror 310 comprises a current source 312, a switch SW1, and mirror transistors N1,N2. The mirror transistor N2 is a high-voltage N-type transistor comprising a drain capable of withstanding high voltages. In one embodiment, the mirror transistor N1 may also be the high-voltage N-type transistor comprising a drain capable of withstanding high voltages. The current source 312 is coupled to the power VDD for providing a current I1. The switch SW1 is coupled between the current source 312 and the drain of the mirror transistor N1. The switch SW1 is controlled to turn on or off according to a control signal Ctrl. The drain and the source of the mirror transistor N1 are coupled to the switch SW1 and the ground GND, respectively. The drain and the gate of the mirror transistor N1 are both coupled to the gate of the mirror transistor N2. The drain and the source of the mirror transistor N2 are coupled to the gate of the transistor P1 and ground GND, respectively. In one embodiment, the switching unit 300 capable of withstanding high voltages can be implemented in the battery management system 100 of FIG. 1 or the battery management system 200 of FIG. 2. When the controller 120 of FIG. 1 or the controller 220 of FIG. 1 provides the control signal Ctrl to turn on the switching unit 300, the switch SW1 is turned on. A gate voltage of the mirror transistor N2 is equal to a drain voltage of the mirror transistor N1. At this time, the drain voltage of the mirror transistor N1 is VDD, so that the mirror transistor N2 is turned on. Thus, the current mirror 310 may generate a mirror current I2 according to the current I1 from the current source 312. The ratio of the current I1 and the mirror current I2 is determined according to the size (a width/length ratio) of the mirror transistors N1 and N2.

When a voltage difference between the gate voltage and the source voltage of the transistor P1 is larger than a threshold voltage of the transistor P1 (i.e. $V_{GS\_P1}=(Vin-I2\times R1)>|V_{th\_P1}|$), the transistor P1 is turned on. Thus, an input voltage Vin at the input terminal IN is transmitted to the output terminal OUT via the blocking unit 320. The input voltage Vin is a voltage coupled to the switching unit 300. In the embodiment, a forward bias voltage of the diode D1 of the blocking unit 320 is about 0.7V. As described above, the output terminal OUT of the switching unit 300 is coupled to a voltage divider. Therefore, when the switching unit 300 is turned on, the switching unit 300 provides an output voltage Vout to the subsequent voltage divider (e.g. the voltage divider 150 of FIG. 1 or the first voltage divider 260 or the second voltage divider 270 of FIG. 2) via the output terminal OUT. In FIG. 3, there is a fixed voltage difference (about 0.7 V) between the input voltage Vin of the input terminal IN and the output voltage Vout of the output terminal OUT. By providing the control signal Ctrl to turn on the switching unit 300, the controller obtains a voltage coupled to the switching unit 300. Furthermore, when the switch SW1 is turned off by the control signal Ctrl, the gate voltage of the mirror transistor N2 is equal to the drain voltage of the mirror transistor N1. At this time, the drain voltage of the mirror transistor N1 is 0. Therefore, the mirror transistor N2 is turned off, and no mirror current I2 is generated by the current mirror 310, thereby the transistor P1 is turned off. Thus, the switching unit 300 is turned off, and the terminal voltage of the battery cell coupled to the switching unit 300 cannot be transmitted to the subsequent voltage divider.

In another embodiment, the current mirror 310 further comprises a transistor N3. A drain of the transistor N3 is coupled to the gates of the mirror transistors N1 and N2, and a source of the transistor N3 is coupled to the ground GND. When the switch SW1 is turned on, a gate G of the transistor N3 is coupled to a control signal with a low voltage level (e.g. 0V), such that the transistor N3 is turned off. When the switch SW1 is turned off, the gate G of the transistor N3 is coupled to a control signal with a high voltage level (e.g. 5V), such that the transistor N3 is turned on. Therefore, it is guaranteed that the mirror transistor N2 is turned off due to a gate voltage of the mirror transistor N2 is 0V when the switch SW1 is turned off.

Figure 4:
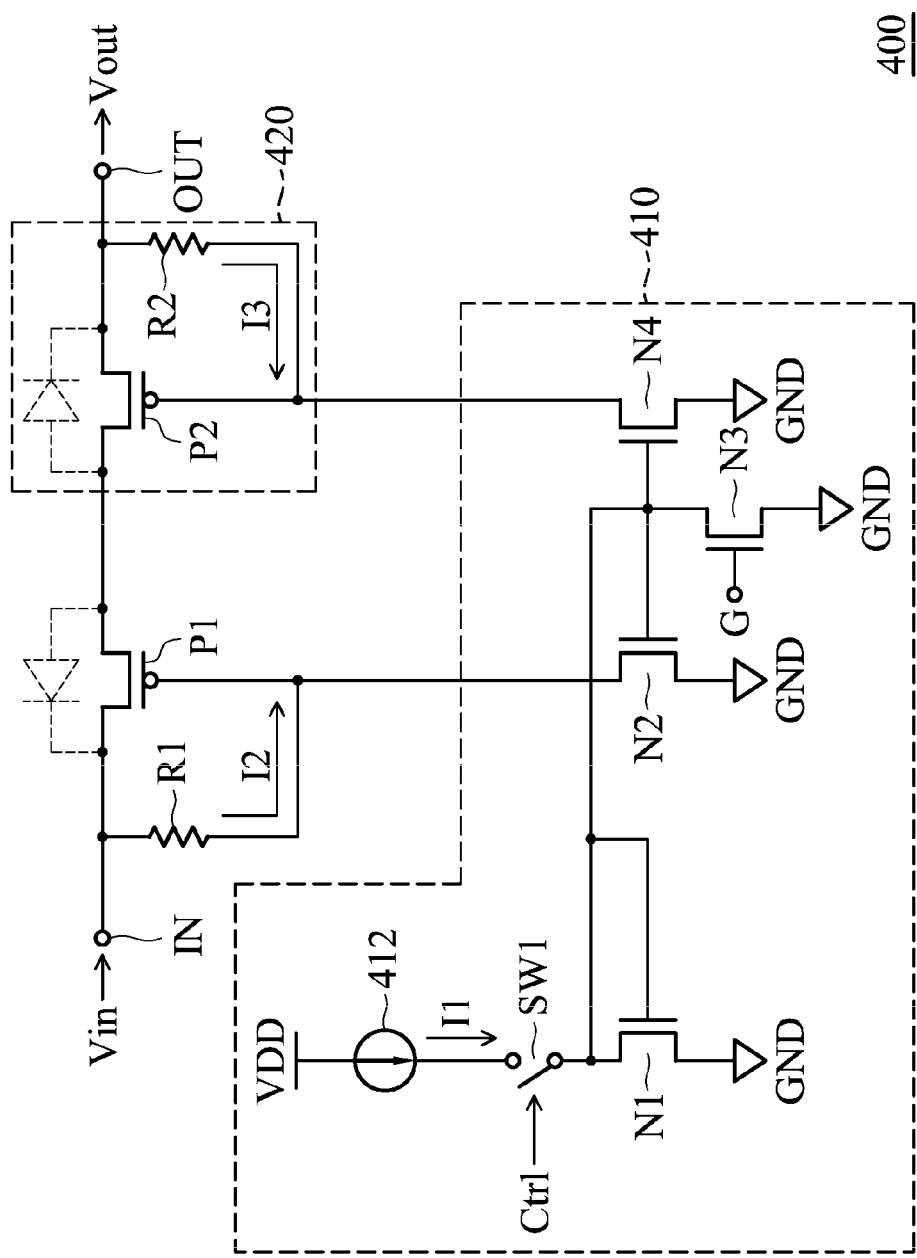
FIG. 4 shows a switching unit capable of withstanding high voltages according to another embodiment of the invention.

FIG. 4 shows a switching unit 400 capable of withstanding high voltages according to another embodiment of the invention. Compared to the switching unit 300 of FIG. 3, a blocking unit 420 of FIG. 4 further comprises a transistor P2 and a resistor R2. The transistor P2 is coupled between the transistor P1 and the output terminal OUT. The transistor P2 is a high-voltage P-type transistor comprising a drain capable of withstanding high voltages. The resistor R2 is coupled between the output terminal OUT and a gate of the transistor P2. Furthermore, compared to the current mirror 310 of FIG. 3, a current mirror 410 further comprises a mirror transistor N4. The mirror transistor N4 is a high-voltage N-type transistor comprising a drain capable of withstanding high voltages. A drain and a source of the mirror transistor N4 are coupled to the gate of the transistor P2 and the ground GND, respectively. In FIG. 4, when the switch SW1 is turned on by the control signal Ctrl, the gate voltages of the mirror transistor N2 and the mirror transistor N4 are equal to a drain voltage of the mirror transistor N1. At this time, the drain voltage of the mirror transistor N1 is VDD, thus the mirror transistor N2 and the mirror transistor N4 are turned on. Therefore, the current mirror 410 generates the mirror currents I2 and I3 according to the current I1 of the current source 412. The ratio of the current I1 and the mirror current I2 is determined according to the size (a width/length ratio) of the mirror transistor N1 and the mirror transistor N2. The ratio of the current I1 and the mirror current I4 is determined according to the size (a width/length ratio) of the mirror transistor N1 and the mirror transistor N4.

When a voltage difference between the gate voltage and the source voltage of the transistor P1 is larger than a threshold voltage of the transistor P1 (i.e. $V_{GS\_P1}=(Vin-I2\times R1)>|V_{th\_P1}|$), the transistor P1 is turned on. Similarly, when a voltage difference between the gate voltage and the source voltage of the transistor P2 is larger than a threshold voltage of the transistor P2 (i.e. $V_{GS\_P21}=(Vin-I3\times R2)>|V_{th\_P2}|$), the transistor P2 is turned on. Thus, an input voltage Vin at the input terminal IN is transmitted to the output terminal OUT. The input voltage Vin is a voltage coupled to the switching unit 400. As described above, the output terminal OUT of the switching unit 400 is coupled to a voltage divider. Therefore, when the switching unit 400 is turned on, the switching unit 400 provides an output voltage Vout to the subsequent voltage divider via the output terminal OUT. The voltage level of the output voltage Vout is equal to the input voltage Vin. By providing the control signal Ctrl to turn on the switching unit 400, the controller obtains the terminal voltage of the battery cell coupled to the switching unit 400. Furthermore, when the switch SW1 is turned off by the control signal Ctrl, the gate voltages of the mirror transistors N2 and N4 are equal to the drain voltage of the mirror transistor N1, and thus a drain voltage of the mirror transistor N1 is 0. Then, the mirror transistors N2 and N4 are turned off, and no mirror currents I2 and I3 are generated by the current mirror 410, thereby the transistors P1 and P2 are turned off. Thus, the switching unit 400 is turned off, and the terminal voltage of the battery cell coupled to the switching unit 400 cannot be transmitted to the subsequent voltage divider.

In FIG. 4, the transistor P1 and the transistor P2 are connected back-to-back (i.e. the drains of the transistors P1 and P2 are coupled to the input terminal IN and the output terminal OUT, respectively). No current flows through the parasitic PN junctions of the transistors P1 and P2 when the transistors P1 and P2 are turned off.

In another embodiment, the current mirror 410 further comprises a transistor N3. A drain of the transistor N3 is coupled to the gates of the mirror transistors N2 and N4, and a source of the transistor N3 is coupled to the ground GND. When the switch SW1 is turned on, a gate G of the transistor N3 is coupled to a control signal with a low voltage level (e.g. 0V), such that the transistor N3 is turned off. When the switch SW1 is turned off, the gate G of the transistor N3 is coupled to a control signal with a high voltage level (e.g. 5V), such that the transistor N3 is turned on. Therefore, it is guaranteed that the mirror transistors N2 and N4 are turned off due to the gate voltages of the mirror transistors N2 and N4 are 0V when the switch SW1 is turned off.

In FIG. 4, the channel length modulation effect of a transistor (also known as the Early effect), a variation of the terminal voltage of a battery cell will cause a little variation in the mirror currents I2 and I3 generated by the current mirror 410. The variation between the mirror currents I2 and I3 could be decreased by decreasing the channel length modulation effect.

Figure 5:
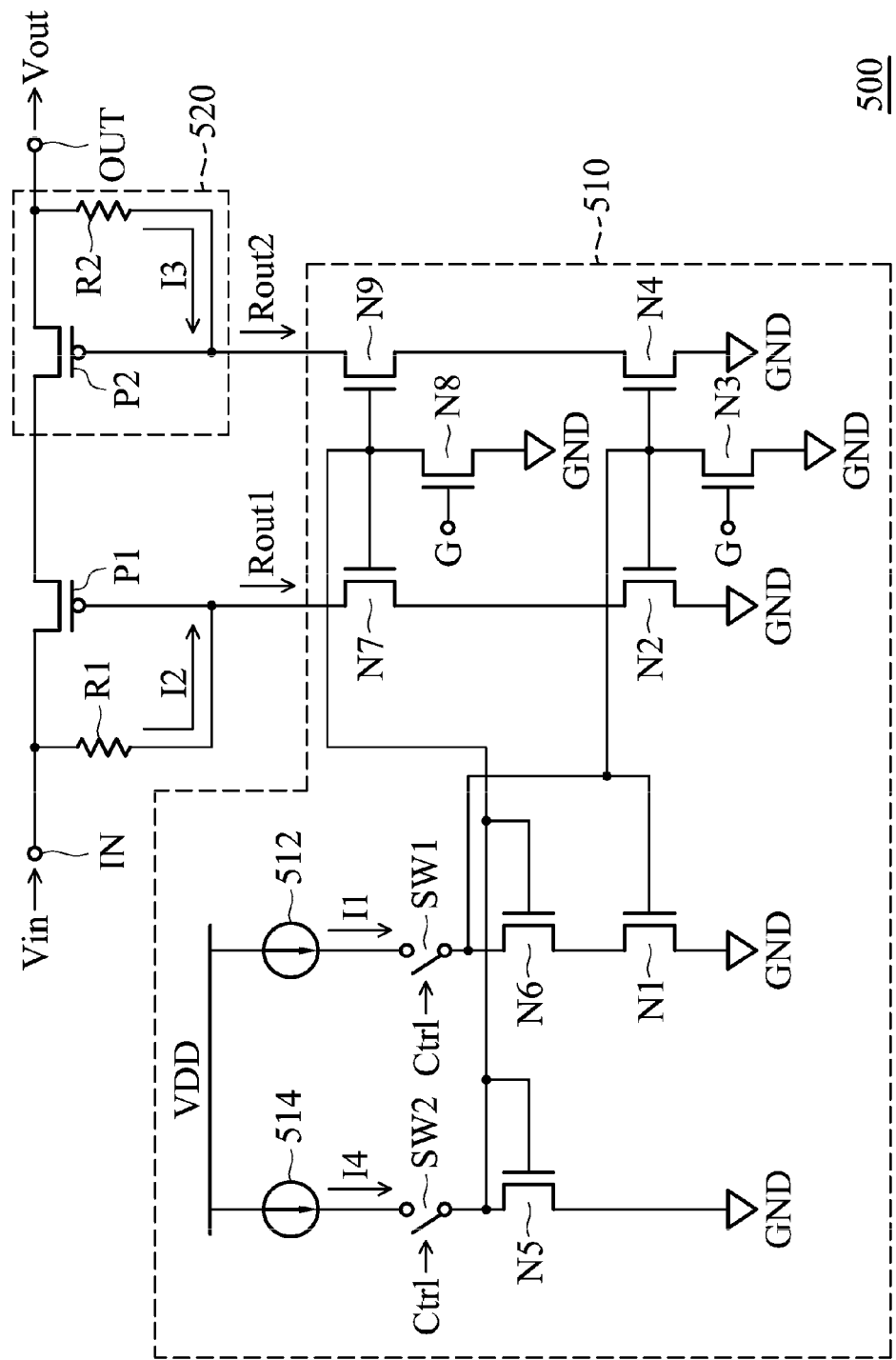
FIG. 5 shows a switching unit capable of withstanding high voltages according to another embodiment of the invention.

A switching unit is provided to decrease the channel length modulation effect in the invention. FIG. 5 shows a switching unit 500 capable of withstanding high voltages according to another embodiment of the invention. The switching unit 500 comprises a transistor P1, a resistor R1, a blocking unit 520 and a cascade current mirror 510. The cascade current mirror 510 comprises current sources 512 and 514, mirror transistors N1, N2 and N4, transistors N5, N7 and N9 and a transistor N6. The cascade current mirror 510 may increase an equivalent resistance Rout1 between a gate of the transistor P1 and the ground GND, and increase an equivalent resistance Rout2 between a gate of the transistor P2 and the ground GND to decrease the channel length modulation effect. Thus, the mirror currents I2 and I3 could be kept at a fixed value when the terminal voltage of the battery cell changes. In the cascade current mirror 510, the current sources 512 and 514 are coupled to the power VDD. The current source 512 is used to provide a current I1 and the current source 514 is used to provide a current I4. The switch SW1 is coupled between the current source 512 and a drain of the transistor N6, and the switch SW2 is coupled between the current source 514 and a drain of the transistor N5. A source of the transistor N5 is coupled to the ground GND, and the gate and the drain of the transistor N5 are coupled to a gate of the transistor N6. A source of the transistor N6 is coupled to a drain of the mirror transistor N1, and a gate of the transistor N6 is coupled to the gates of the transistors N7 and N9. The gate and the source of the mirror transistor N1 are coupled to the switch SW1 and the ground GND, respectively. The drain and the source of the transistor N7 are coupled to the gate of the transistor P1 and the drain of the mirror transistor N2, respectively. The drain and the source of the transistor N9 are coupled to the gate of the transistor P2 and the drain of the mirror transistor N4, respectively. The gate and the source of the mirror transistor N2 are coupled to the gate of the transistor N1 and the ground GND, respectively. The gate and the source of the mirror transistor N4 are coupled to the gate of the transistor N1 and the ground GND, respectively. Other device connection relationships are shown in FIG. 5, and will not be described herein. In the embodiment, the mirror transistors N1, N2 and N4 are channel length variable transistors. The variation between the mirror currents I2 and I3 could be decreased by increasing the channel lengths of the mirror transistors N1, N2 and N4, so as to decrease the channel length modulation effect. Furthermore, the switches SW1 and SW2 are controlled by the control signal Ctrl simultaneously. When the switches SW1 and SW2 are turned on by the control signal Ctrl simultaneously, the cascade current mirror 510 generates bias signals according to the current I4 from the current source 514, to control the gates of the transistors N6, N7 and N9. Furthermore, when the switches SW1 and SW2 are turned on simultaneously, the gate voltages of the mirror transistors N2 and N4 are equal to the drain voltage of the transistor N6. At this time, the drain voltage of the transistor N6 is VDD, thus the mirror transistor N2 and the mirror transistor N4 are turned on. In the meantime, the cascade current mirror 510 generates the mirror currents I2 and I3 according to the current I1 from the current source 512. A ratio of the current I1 and the mirror currents I2 is determined according to the size (a width/length ratio) of the mirror transistor N1 and the mirror transistors N2. The ratio of the current I1 and the mirror current I4 is determined according to the size (a width/length ratio) of the mirror transistor N1 and the mirror transistor N4.

When the transistors P1 and P2 are turned on, an input voltage Vin at the input terminal IN is transmitted to the output terminal OUT. The input voltage Vin is a terminal voltage of a battery cell coupled to the switching unit 500. As described above, the output terminal OUT of the switching unit 500 is coupled to a voltage divider. When the switching unit 500 is turned on, the switching unit 500 provides an output voltage Vout to the subsequent voltage divider via the output terminal OUT. A voltage level of the output voltage Vout is equal to that of the input voltage Vin. By providing the control signal Ctrl to turn on the switching unit 500, the controller obtains the terminal voltage of the battery cell coupled to the switching unit 500. In the embodiment, the transistors P1 and P2 are high-voltage P-type transistors each having a drain capable of withstanding high voltages, and the transistors N7 and N9 are high-voltage N-type transistors each having a drain capable of withstanding high voltages. The mirror transistors N1, N2 and N4 and the transistors N5 and N6 can be implemented by the normal N-type transistors.

In other embodiments, the cascade current mirror 510 further comprises the transistors N3 and N8, wherein the transistors N3 and N8 have the same functions as the transistor N3 of FIG. 3 and FIG. 4, and will not be described herein.

Figure 6:
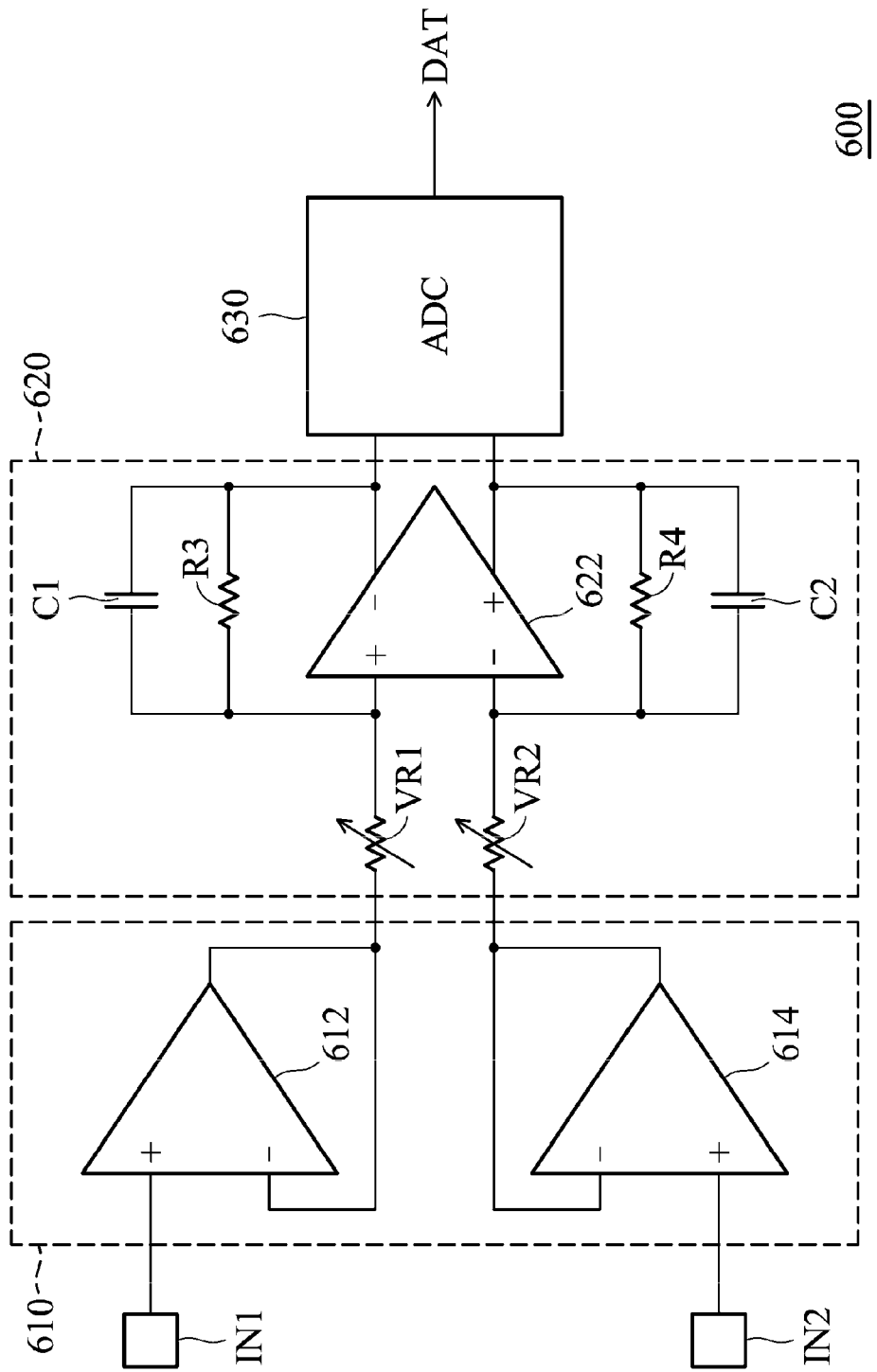
FIG. 6 shows a detection circuit 600 according to an embodiment of the invention.

FIG. 6 shows a detection circuit 600 according to an embodiment of the invention, wherein the detection circuit 600 may be the detection circuit 130 of FIG. 1 or the detection circuit 230 of FIG. 2. The detection circuit 600 comprises an input buffer 610, an amplifying circuit 620 and an analog-to-digital converter (ADC) 630. The input buffer 610 comprises amplifiers 612 and 614. A non-inverting input terminal of the amplifier 612 is coupled to an input terminal IN1 of the detection circuit 600, and an inverting input terminal of the amplifier 612 is coupled to an output terminal of the amplifier 612. A non-inverting input terminal of the amplifier 614 is coupled to an input terminal IN2 of the detection circuit 600, and an inverting input terminal of the amplifier 614 is coupled to an output terminal of the amplifier 614. In the embodiment, because the amplifiers 612 and 614 have high input impedances, a voltage dividing signal provided by the voltage divider will not be attenuated.

Furthermore, the amplifying circuit 620 comprises variable resistors VR1 and VR2, resistors R3 and R4, capacitors C1 and C2 and a differential amplifier 622. The variable resistors VR1 and VR2 have the same resistor values, and the resistors R3 and R4 have the same resistor values. The variable resistor VR1 is coupled between a non-inverting input terminal of the differential amplifier 622 and the output terminal of the amplifier 612, and the variable resistor VR2 is coupled between an inverting input terminal of the differential amplifier 622 and the output terminal of the amplifier 614. The capacitor C1 and the resistor R3 are coupled between the non-inverting input terminal and an inverting output terminal of the differential amplifier 622 for filtering a signal from the amplifier 612. The capacitor C2 and the resistor R4 are coupled between the inverting input terminal and the non-inverting output terminal of the differential amplifier 622 for filtering a signal from the amplifier 614. In the amplifying circuit 620, the gain value of the amplifying circuit 620 is adjusted by controlling the ratio of the variable resistor VR1 (VR2) and the resistor R3 (R4). Furthermore, the voltage difference between the input terminal IN1 and the input terminal IN2 of the detection circuit 600 forms a pair of differential signals at a common node via the amplifying circuit 620, and the pair of differential signals are transmitted to the ADC 630. Next, the ADC 630 converts the pair of differential signals to generate a digital signal DAT.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A battery management system for a battery pack, wherein the battery pack comprises a plurality of battery cells connected in series, the system comprising:
   a first voltage divider;
   a plurality of first switching units, each of the first switching units being corresponding to one of the plurality of battery cells and each of the first switching units being coupled between an anode of the corresponding battery cell and the first voltage divider; and
   a detection circuit coupled to the first voltage divider, wherein when a control signal directs one of the first switching units to turn on, the first voltage divider divides a first voltage difference transmitted from the one of the first switching units to obtain a first divided voltage signal, and transmits the first divided voltage signal to the detection circuit, and the detection circuit detects the first voltage difference according to the first divided voltage signal,
   wherein the first voltage difference is a voltage difference between an anode of the battery cell corresponding to the one of the first switching units and a ground,
   wherein each of the first switching units comprises:
   a first P-type transistor coupled between the anode of the corresponding battery cell and the first voltage divider;
   a first resistor coupled between the anode of the corresponding battery cell and a gate of the first P-type transistor; and
   a current mirror coupled to a gate of the first P-type transistor and the first resistor, draining a first mirror current from the first resistor in response to the control signal, so as to turn on the first P-type transistor,
   wherein each of the first switching units further comprises a blocking unit coupled between the first voltage divider and the first P-type transistor, wherein the blocking unit comprises:
   a diode, having an anode coupled to the first P-type transistor and a cathode coupled to the first voltage divider.

2. The battery management system as claimed in claim 1, wherein when the one of the first switching units is turned on by the control signal, the other first switching units are turned off.

3. The battery management system as claimed in claim 1, wherein the current mirror comprises:
   a current source;
   a first switch being turned on or off by the control signal;
   a first mirror transistor coupled between the first switch and the ground; and
   a second mirror transistor coupled between the gate of the first P-type transistor and the ground, the second mirror transistor having a gate coupled to a gate of the first mirror transistor and the first switch,
   wherein the first P-type transistor and the second mirror transistor are high-voltage transistors.

4. The battery management system as claimed in claim 1, wherein the first voltage divider comprises:
   a first voltage-dividing resistor coupled between the first switching units and the detection circuit; and
   a second voltage-dividing resistor coupled between the first voltage-dividing resistor and the ground.

5. The battery management system as claimed in claim 1, wherein the detection circuit comprises:
   an input buffer coupled to the first voltage divider, receiving the first divided voltage signal;
   an amplifying circuit coupled to the input buffer, amplifying and filtering the first divided voltage signal; and
   an analog-to-digital converter coupled to the amplifying circuit, converting the first divided voltage signal into a digital signal.

6. The battery management system as claimed in claim 1, further comprising:
   a second voltage divider coupled to the detection circuit; and
   a plurality of second switching units, each of the second switching units being corresponding to one of the plurality of battery cells and each of the second switching units being coupled between a cathode of the corresponding battery cell and the second voltage divider,
   wherein when the control signal directs one of the second switching units to turn on, the second voltage divider divides a second voltage difference transmitted from the one of the second switching units to obtain a second divided voltage signal, and transmits the second divided voltage signal to the detection circuit, and the detection circuit detects the second voltage difference according to the second divided voltage signal,
   wherein the second voltage difference is a voltage difference between a cathode of the battery cell corresponding to the one of the second switching units and the ground.

7. The battery management system as claimed in claim 6, wherein the detection circuit further obtains a voltage difference between the anode and the cathode of the battery cell corresponding to the one of the first switching units according the first voltage difference and the second voltage difference.

8. A battery management system for a battery pack, wherein the battery pack comprises a plurality of battery cells connected in series, the system comprising:
- a first switching unit coupled to an anode of a first battery cell of the battery pack, comprising:
- a first P-type transistor coupled to the anode of the first battery cell;
- a first resistor coupled between the anode of the first battery cell and a gate of the first P-type transistor; and
- a current mirror coupled to the gate of the first P-type transistor and the first resistor, draining a first mirror current from the first resistor in response to a control signal, so as to turn on the first P-type transistor; and
- a detection circuit coupled to the first switching unit, wherein when the first P-type transistor is turned on by the control signal, the detection circuit obtains a first voltage difference between the anode of the first battery cell and a ground via the first switching unit,
- wherein the first switching unit further comprises a blocking unit coupled between the first P-type transistor and the detection circuit, wherein the blocking unit comprises:
- a diode, having an anode coupled to the first P-type transistor and a cathode coupled to the detection circuit.

9. The battery management system as claimed in claim 8, wherein the current mirror comprises:
- a current source;
- a first switch being turned on or off by the control signal;
- a first mirror transistor coupled between the first switch and the ground;
- a second mirror transistor coupled between the gate of the first P-type transistor and the ground, having a gate coupled to a gate of the first mirror transistor and the first switch,
- wherein the first P-type transistor and the second mirror transistor are high-voltage transistors.

10. The battery management system as claimed in claim 8, further comprising:
- a first voltage divider coupled between the first switching unit and the detection circuit, comprising:
- a first voltage-dividing resistor coupled between the detection circuit and the first P-type transistor; and
- a second voltage-dividing resistor coupled between the first voltage-dividing resistor and the ground.

11. The battery management system as claimed in claim 10, wherein the detection circuit comprises:
- an input buffer coupled to the first voltage divider, receiving a divided voltage signal;
- an amplifying circuit coupled to the input buffer, amplifying and filtering the divided voltage signal; and
- an analog-to-digital converter coupled to the amplifying circuit, converting the divided voltage signal into a digital signal.

* * * * *